(12) United States Patent
Heo et al.

(10) Patent No.: US 10,741,498 B2
(45) Date of Patent: Aug. 11, 2020

(54) SEMICONDUCTOR PACKAGE

(71) Applicant: SAMSUNG ELECTRONICS CO., LTD., Suwon-si (KR)

(72) Inventors: Yu Seon Heo, Suwon-si (KR); Jae Kul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/357,783

(22) Filed: Mar. 19, 2019

(65) Prior Publication Data

US 2020/0020638 A1 Jan. 16, 2020

(30) Foreign Application Priority Data

Jul. 12, 2018 (KR) .................. 10-2018-0081028

(51) Int. Cl.
*H01L 23/538* (2006.01)
*H01L 25/065* (2006.01)
(Continued)

(52) U.S. Cl.
CPC ...... *H01L 23/5386* (2013.01); *H01L 23/3128* (2013.01); *H01L 23/481* (2013.01); *H01L 23/5226* (2013.01); *H01L 23/5283* (2013.01); *H01L 23/5383* (2013.01); *H01L 24/09* (2013.01); *H01L 24/17* (2013.01); *H01L 24/33* (2013.01); *H01L 24/73* (2013.01); *H01L 25/0652* (2013.01); *H01L 25/18* (2013.01);
(Continued)

(58) Field of Classification Search
CPC ............ H01L 23/5386; H01L 23/3128; H01L 23/481; H01L 23/5226; H01L 23/5283; H01L 23/5383; H01L 24/09; H01L 24/17; H01L 24/73; H01L 25/0652; H01L 25/18
See application file for complete search history.

(56) References Cited

U.S. PATENT DOCUMENTS 9,524,959 B1 * 12/2016 Yeh ..................... H01L 23/5383
10,134,685 B1 * 11/2018 Chen ................... H01L 21/4857
(Continued)

FOREIGN PATENT DOCUMENTS

JP 2016-535463 A 11/2016
KR 10-2013-0118175 A 10/2013
(Continued)

OTHER PUBLICATIONS

Communication dated Nov. 29, 2019, issued by the Taiwanese Patent Office in counterpart Taiwanese Application No. 108109200.
(Continued)

*Primary Examiner* — Nathan W Ha
(74) *Attorney, Agent, or Firm* — Sughrue Mion, PLLC

(57) ABSTRACT

A semiconductor package includes: a first structure including a plurality of stacked first semiconductor chips and electrically connected to a first redistribution layer through connection vias having different heights; and a second structure including a second semiconductor chip electrically connected to a second redistribution layer. The first and second redistribution layers are electrically connected to each other through an electrical connection member formed on the second structure.

16 Claims, 14 Drawing Sheets

(51) Int. Cl.
*H01L 23/00* (2006.01)
*H01L 23/31* (2006.01)
*H01L 23/522* (2006.01)
*H01L 23/528* (2006.01)
*H01L 23/48* (2006.01)
*H01L 25/18* (2006.01)

(52) U.S. Cl.
CPC ............ *H01L 2224/02373* (2013.01); *H01L 2224/02377* (2013.01); *H01L 2224/02379* (2013.01); *H01L 2224/02381* (2013.01); *H01L 2224/0401* (2013.01); *H01L 2224/73253* (2013.01); *H01L 2924/1436* (2013.01); *H01L 2924/1438* (2013.01)

(56) References Cited

U.S. PATENT DOCUMENTS

| | | | |
|---|---|---|---|
| 2008/0094793 A1* | 4/2008 | Sakurai | G11C 5/04 361/679.01 |
| 2013/0277831 A1 | 10/2013 | Yoon et al. | |
| 2015/0108661 A1* | 4/2015 | Vincent | H01L 24/30 257/777 |
| 2015/0371938 A1* | 12/2015 | Katkar | H01L 25/50 257/774 |
| 2016/0079184 A1* | 3/2016 | Tsukiyama | H01L 24/16 257/737 |
| 2016/0086931 A1 | 3/2016 | Jang et al. | |
| 2016/0161992 A1 | 6/2016 | Kwon | |
| 2016/0276307 A1* | 9/2016 | Lin | H01L 21/561 |
| 2017/0025385 A1* | 1/2017 | Song | H01L 25/105 |
| 2017/0133351 A1* | 5/2017 | Su | H01L 21/6836 |
| 2017/0256528 A1 | 9/2017 | Lim | |
| 2017/0278821 A1 | 9/2017 | Zhao et al. | |
| 2017/0287870 A1 | 10/2017 | Fang et al. | |
| 2017/0345761 A1* | 11/2017 | Yu | H01L 21/6835 |
| 2018/0005974 A1* | 1/2018 | Chiu | H01L 23/5385 |
| 2018/0026022 A1* | 1/2018 | Lee | H01L 21/561 257/659 |
| 2018/0047674 A1* | 2/2018 | Tsai | H01L 23/5383 |
| 2018/0090443 A1 | 3/2018 | Lee et al. | |
| 2018/0096927 A1 | 4/2018 | Kim et al. | |
| 2018/0096968 A1 | 4/2018 | Lee et al. | |
| 2018/0138083 A1 | 5/2018 | Kim et al. | |
| 2018/0211936 A1 | 7/2018 | Chang et al. | |
| 2018/0294241 A1* | 10/2018 | Chen | H01L 24/80 |
| 2019/0074267 A1* | 3/2019 | Yang | H01L 23/5386 |
| 2019/0341369 A1* | 11/2019 | Chang Chien | H01L 22/12 |

FOREIGN PATENT DOCUMENTS

| | | |
|---|---|---|
| KR | 10-2016-0068218 A1 | 6/2016 |
| KR | 10-2018-0061109 A | 6/2018 |
| TW | 201737442 A | 10/2017 |
| TW | I613772 B | 2/2018 |
| TW | 201814861 A | 4/2018 |
| TW | 201824467 A | 7/2018 |
| TW | 201824472 A | 7/2018 |

OTHER PUBLICATIONS

Communication dated Sep. 1, 2019, issued by the Korean Intellectual Property Office in corresponding Korean Application No. 10-2018-0081028.

* cited by examiner

SEMICONDUCTOR PACKAGE

CROSS-REFERENCE TO RELATED APPLICATION

This application claims benefit of priority to Korean Patent Application No. 10-2018-0081028 filed on Jul. 12, 2018 in the Korean Intellectual Property Office, the disclosure of which is incorporated herein by reference in its entirety.

TECHNICAL FIELD

The present disclosure relates to a semiconductor package, for example, a fan-out semiconductor package capable of extending an electrical connection structure beyond a region in which a semiconductor chip is disposed.

BACKGROUND

In order to meet the demand for miniaturization, lightweightedness, high capacity, and versatility in electronic devices, electronic circuit devices should perform more functions in less space. Therefore, various semiconductor chips employed in such electronic devices are required to be thinned and microcircuited, and the technology for packaging such semiconductor chips is also required to be miniaturized and to be made multifunctional. Accordingly, package technology has been actively developed in the direction of realizing the same or different types of semiconductor chips as a single unit package.

For example, in order to improve capacity and processing speed for data of a chip scale package (CSP) and a semiconductor device in which a size of the semiconductor package is only about 110% to 120% of a size of the semiconductor chip, stacked semiconductor packages (SSP) in which a plurality of semiconductor chips are stacked in a vertical direction are being developed. Such a high level of the integration of packaging technology enables more sophisticated electronics to be used without increasing volume.

Meanwhile, in the contemporary stacked semiconductor package, the stacked semiconductor chips are connected to the connection pads of the substrate via the conductive wires. However, an ever-greater number of I/O (input/output) terminals is required, as electronic devices become more multifunctional and highly integrated. Further, as the number of I/O terminals increases, the wire bonding apparatus also increases. Therefore, there is a limit in that a large portion of the semiconductor chip may not be used in the circuit. Particularly, in the case of stacking heterogeneous semiconductor chips, there is a need for a smaller and denser packaging method in order to obtain as much die space as possible.

SUMMARY

An aspect of the present disclosure is to provide a highly integrated semiconductor package which may be made thinner and increased in performance, even in the case that a plurality of semiconductor chips are used.

According to an aspect of the present disclosure, a semiconductor package includes: a plurality of first semiconductor chips each having a first active surface on which a first connection pad is disposed and a first inactive surface, opposing the first active surface, the first semiconductor chips being stacked such that the first connection pads are respectively exposed; a first encapsulant covering at least a portion of each of the plurality of first semiconductor chips; a first connection member disposed in a position lower than a position of the plurality of first semiconductor chips and in a lower portion of the first encapsulant, and including one or more first redistribution layer, and a plurality of connection vias electrically connecting the first connection pads of each of the first semiconductor chips to the one or more first redistribution layer, each of the connection vias penetrating into the first encapsulant, and heights of the connection vias being different from each other; a second semiconductor chip disposed in a position lower than a position of the first connection member, and having a second active surface on which a second connection pad is disposed, and a second inactive surface opposing the second active surface; a second encapsulant disposed in a position lower than a position of the first connection member, and covering at least a portion of the second semiconductor chip; a second connection member disposed in a position lower than positions of the second semiconductor chip and in a lower portion of the second encapsulant, and including at least one second redistribution layer electrically connected to the second connection pad; and an electrical connection member passing through the second encapsulant, and electrically connecting the one or more first redistribution layer and the at least one second redistribution layer.

According to another aspect of the present disclosure, a semiconductor package includes: a plurality of first semiconductor chips each having a first active surface on which a first connection pad is disposed and a first inactive surface, opposing the first active surface, and stacked such that the first connection pads are respectively exposed; a first encapsulant covering at least a portion of each of the plurality of first semiconductor chips; a first connection member disposed in a position lower than positions of the plurality of first semiconductor chips and in a lower portion of the first encapsulant, and including one or more first redistribution layer, and a plurality of connection vias electrically connecting the first connection pads of each of the first semiconductor chips to the one or more first redistribution layers, each of the connection vias penetrating into the first encapsulant, and heights of the connection vias being different from each other; a frame disposed in a position lower than a position of the first connection member, having a through-hole, and including a plurality of wiring layers and one or more layers of wiring vias electrically connecting the plurality of wiring layers; a second semiconductor chip disposed in the through-hole, and having a second active surface on which a second connection pad is disposed, and a second inactive surface opposing the second active surface; a second encapsulant disposed in a position lower than a position of the first connection member, and covering at least a portion of the second semiconductor chip; a second connection member disposed in a position lower than positions of the frame, the second semiconductor chip and in a lower portion of the second encapsulant, and including at least one second redistribution layer electrically connected to the second connection pad; a plurality of first electrical connection structures disposed in a position lower than a position of the second connection member, and electrically connected to the at least one second redistribution layer; and a plurality of second electrical connection structures disposed between the first connection member and the frame, and electrically connecting the first redistribution layer and the plurality of wiring layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
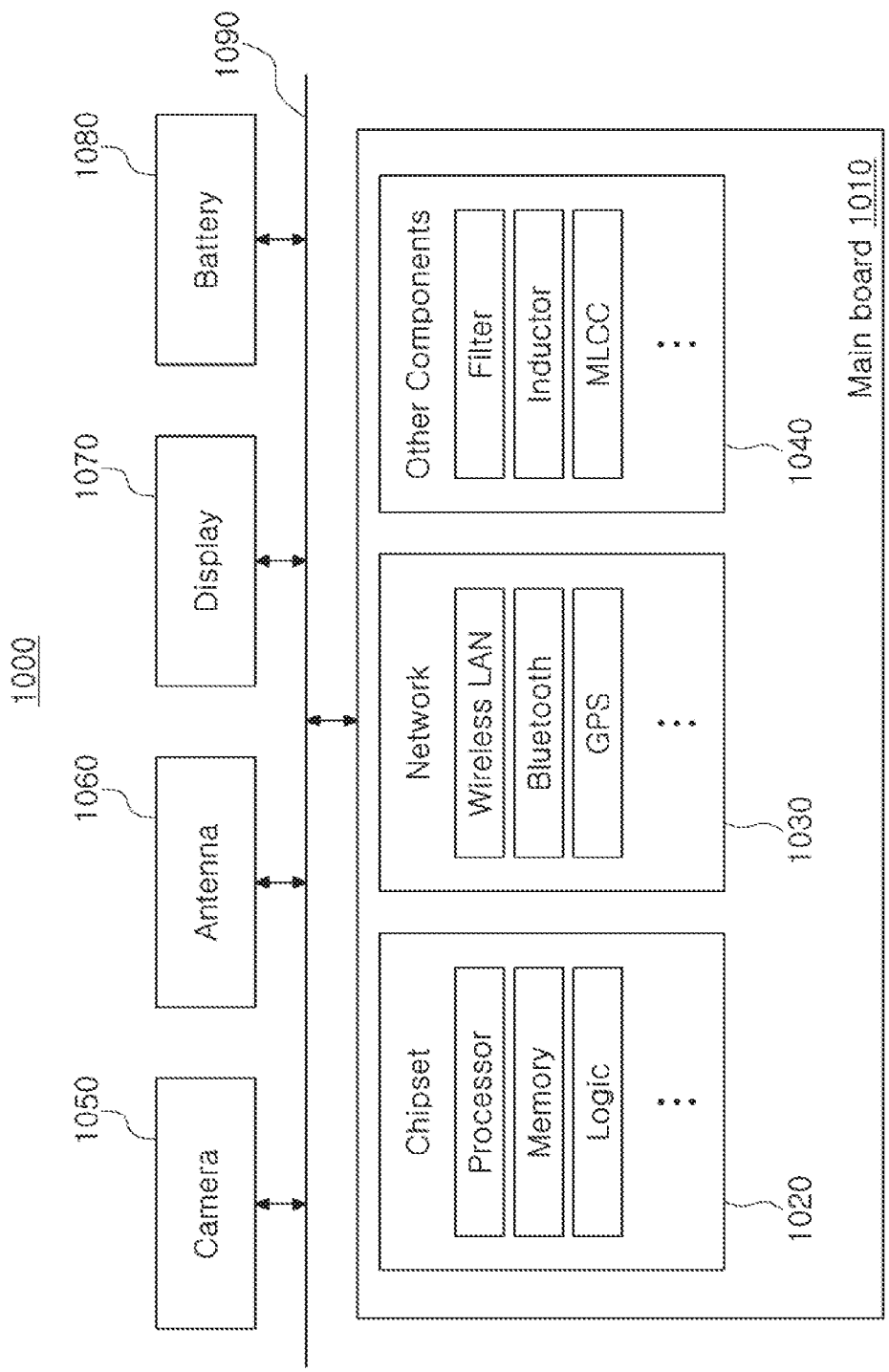
FIG. 1 is a schematic block diagram illustrating an example of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
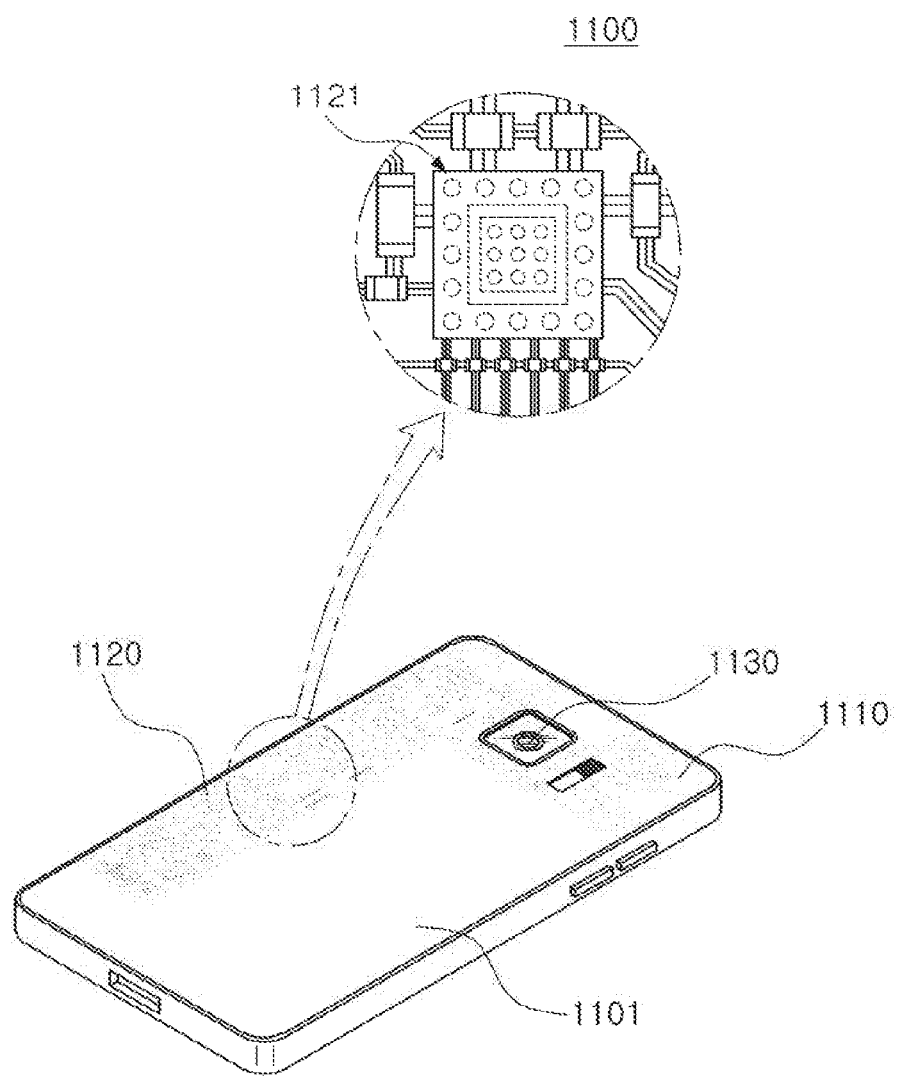
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
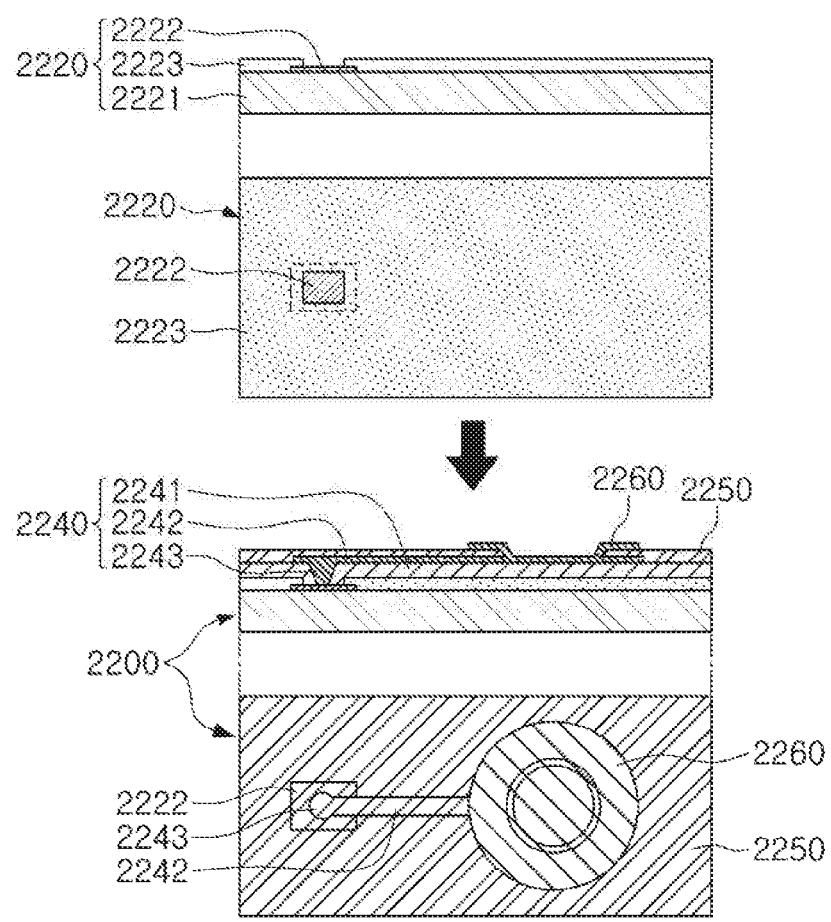
FIGS. 3A and 3B are schematic cross-sectional views illustrating states of a fan-in semiconductor package before and after being packaged.
Figure 3B:
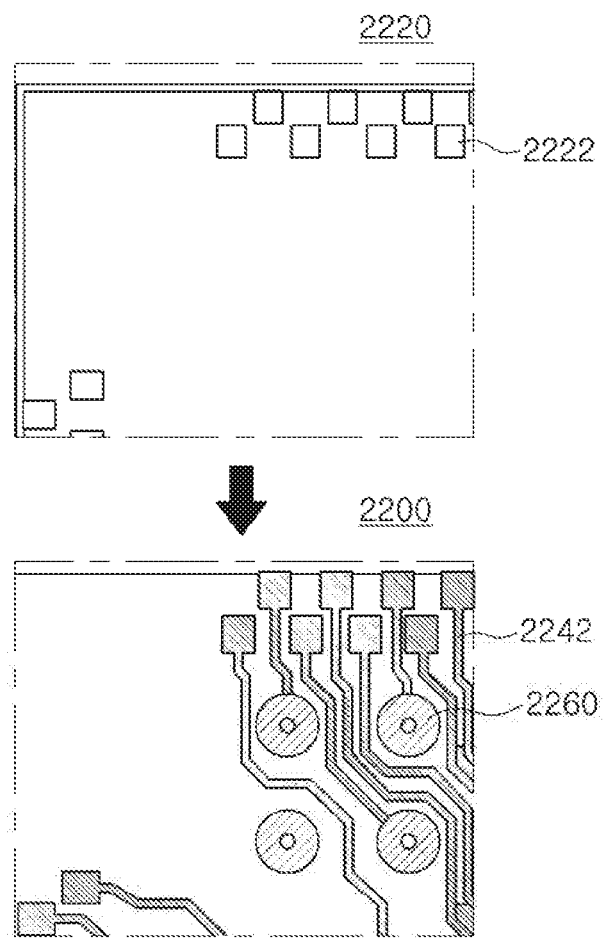

FIGS. 3A and 3B are schematic cross-sectional views illustrating states of a fan-in semiconductor package before and after being packaged.

Figure 4:
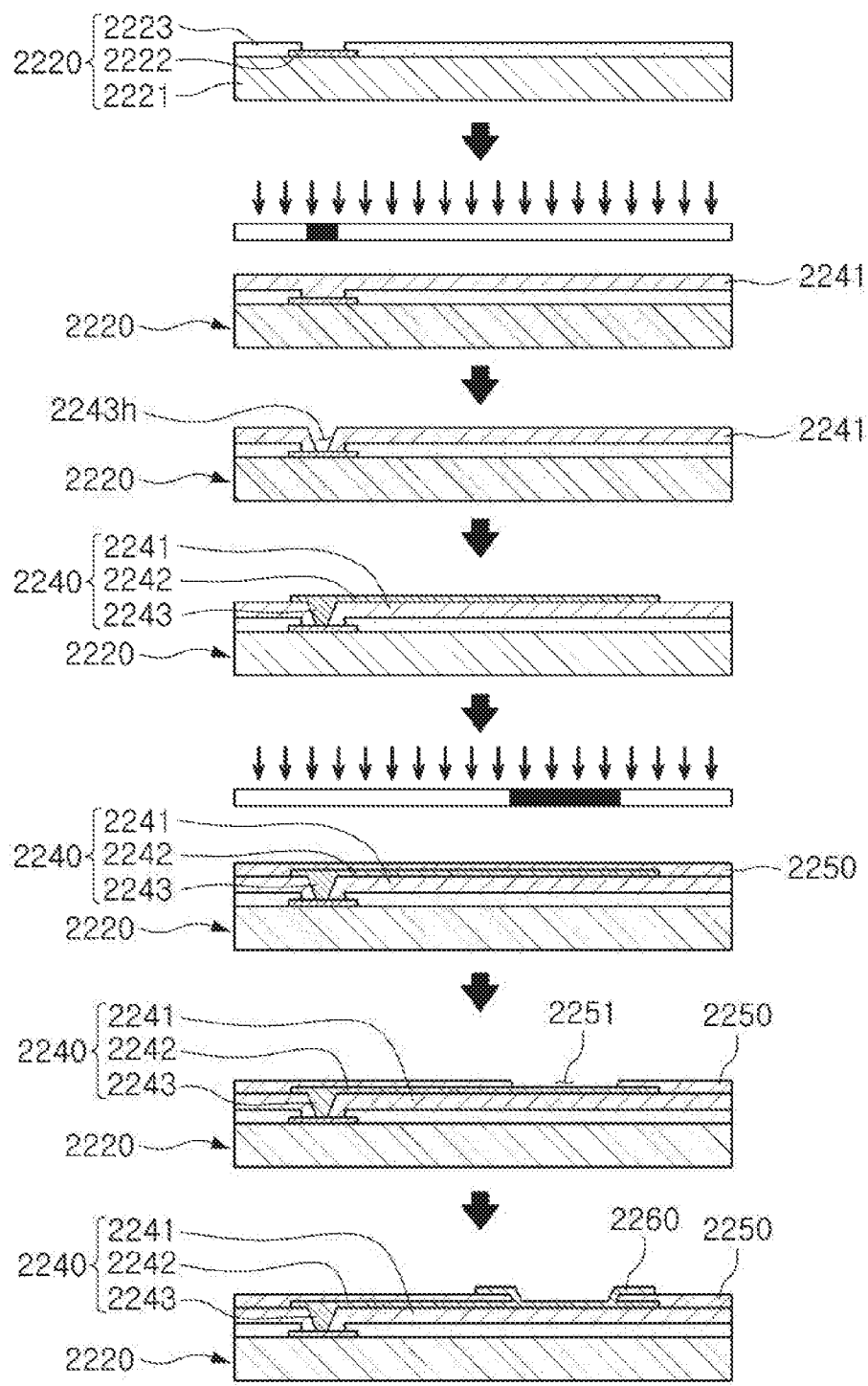
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and via 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
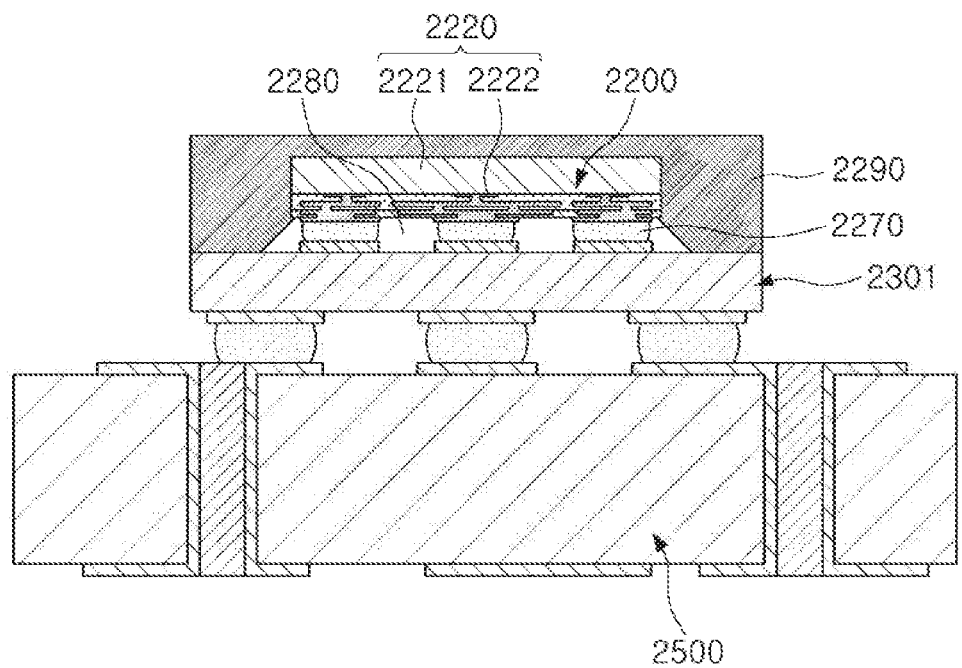
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
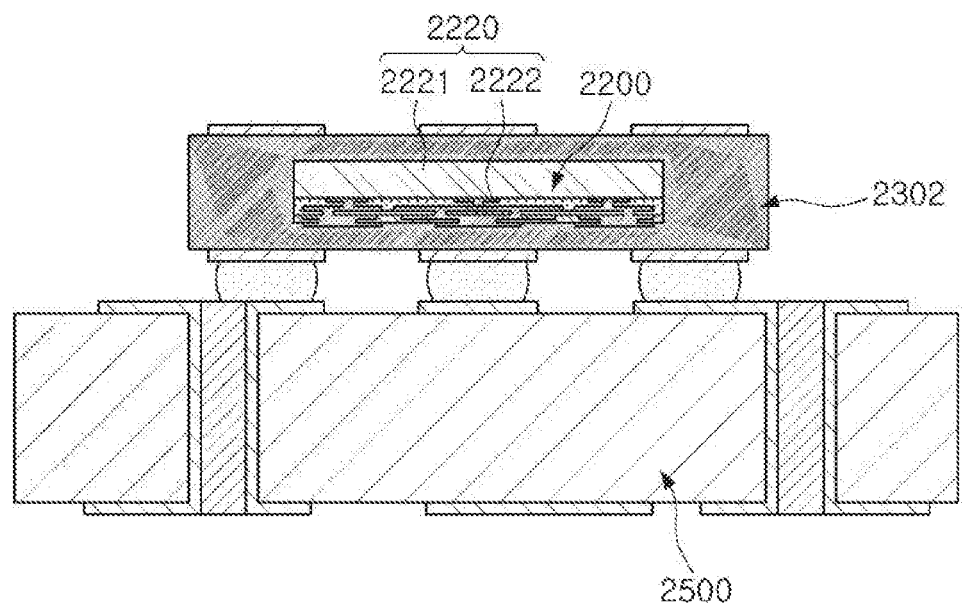
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
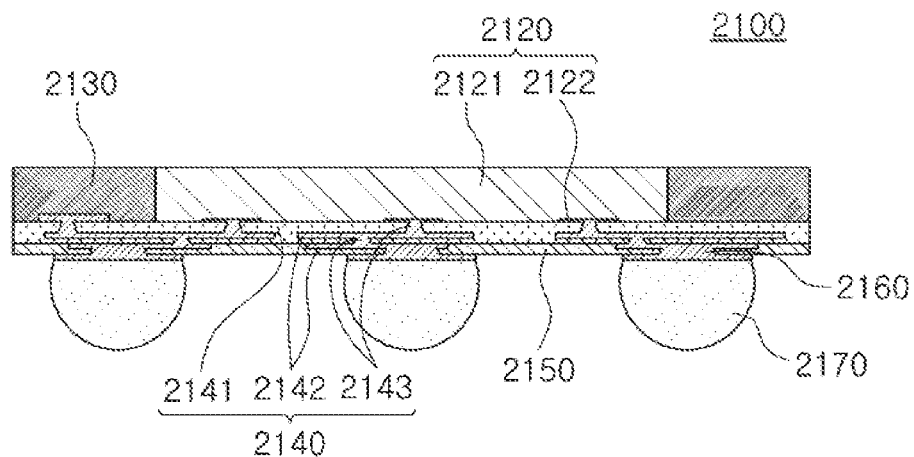
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and via 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. Meanwhile, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
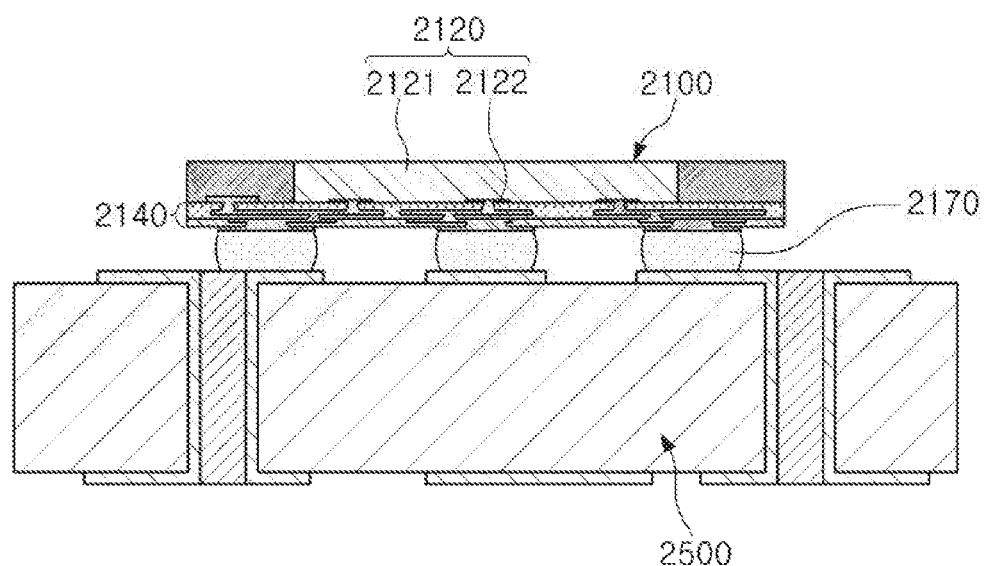
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a highly integrated semiconductor package which may be thinned and improved in performance even though a plurality of semiconductor chips are used will be described with reference to the drawings.

Figure 9:
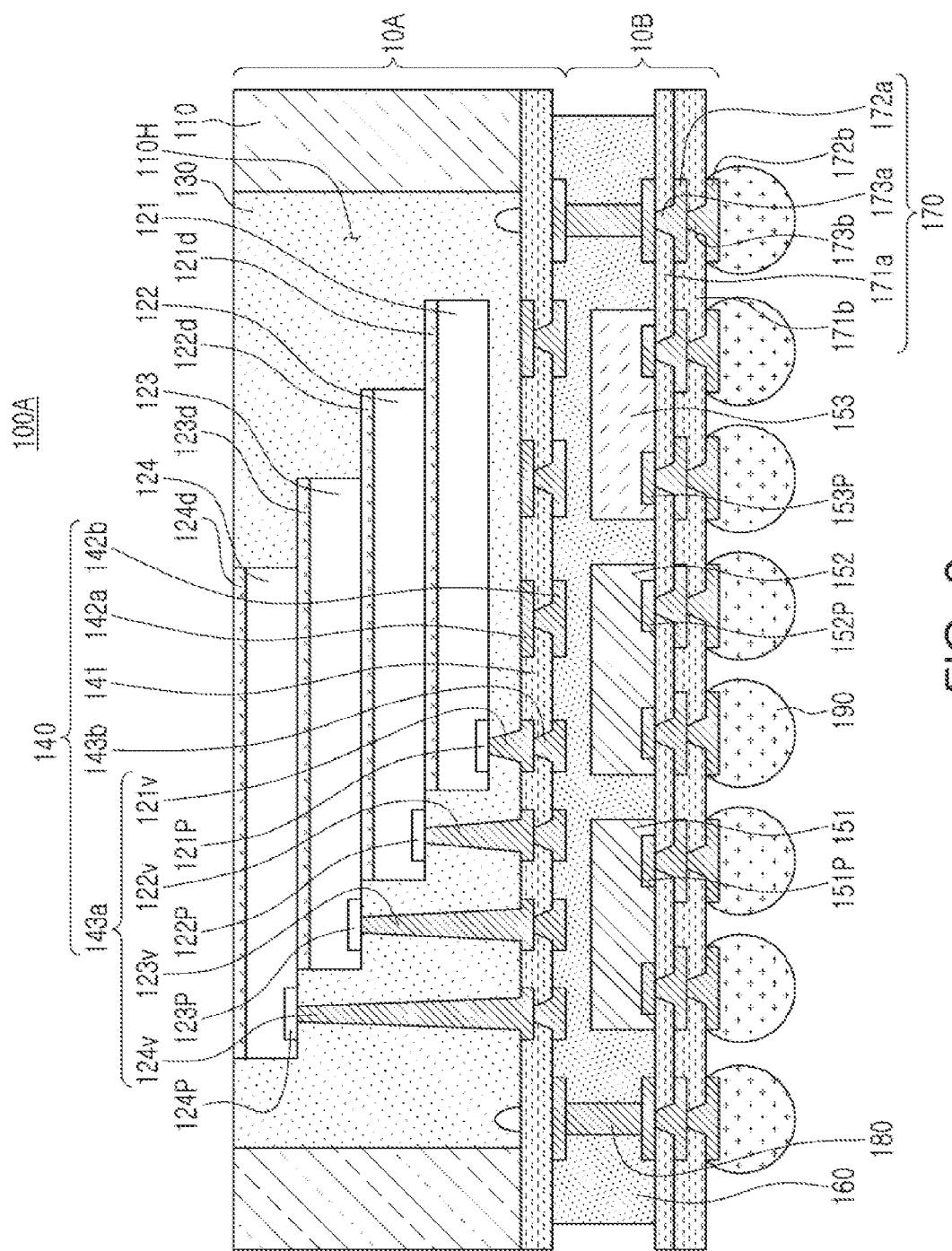
FIG. 9 is a schematic cross-sectional view illustrating an example of a semiconductor package.

FIG. 9 is a schematic cross-sectional view illustrating an example of a semiconductor package.

Referring to FIG. 9, a semiconductor package 100A according to an exemplary embodiment may include a first structure 10A and a second structure 10B. The first structure 10A may include: a frame 110 having a through-hole 110H; a plurality of first semiconductor chips 121 to 124, disposed in the through-hole 110H, respectively having active surfaces on which connection pads 121P to 124P are disposed and inactive surfaces opposite the active surfaces, and stacked to have a stepped shape such that the first connection pads 121P to 124P are respectively exposed; a first encapsulant 130 covering at least a portion of each of the plurality of first semiconductor chips 121 to 124 and filling at least a portion of the through-hole 110H; and a first connection member 140 disposed in a position lower than a position of the frame 110 and the plurality of first semiconductor chips 121 to 124 and in a lower portion of the first encapsulant 130, and including one or more first redistribution layer 142a and 142b, and a plurality of connection vias 121v to 124v electrically connecting the connection pads 121P to 124P of each of the first semiconductor chips 121 to 124 to the first redistribution layer 142a and 142b, each of the connection vias 121v to 124v penetrating into the first encapsulant 130, and heights of the connection vias 121v to 124v being different from each other. The second structure 10B may include: at least one second semiconductor chip 151 and 152, disposed in a position lower than a position of the first connection member 140, and having active surfaces on which connection pads 151P and 152P are disposed, and inactive surfaces opposing the active surfaces; a third semiconductor chip 153, disposed in a position lower than a position of the first connection member 140 and parallel to the second semiconductor chips 151 and 152, and having active surfaces on which a connection pad 153P is disposed, and an inactive surface opposing the active surface; a second encapsulant 160, disposed in a position lower than a position of the first connection member 140 and covering at least a portion of the second semiconductor chips 151 and 152 and the third semiconductor chip 153; a second connection member 170, disposed in a position lower than a position of the second semiconductor chips 151 and 152 and the third semiconductor chip 153 and in a lower portion of the second encapsulant 160, and including at least one second redistribution layer 172a and 172b electrically connected to the connection pads 151P and 152P of the second semiconductor chips 151 and 152 and the connection pad 153P of the third semiconductor chip 153; and an electrical connection member 180 passing through the second encapsulant 160, and electrically connecting the first redistribution layer 142a and 142b and the second redistribution layer 172a and 172b. A plurality of electrical connection structures 190 electrically connected to the second redistribution layers 172a and 172b may be disposed in a position lower than a position of the second structure 10B, e.g., of the second connection member 170.

As described above, in the contemporary stacked semiconductor package, the stacked semiconductor chips may be connected to the connection pads of the substrate through the conductive wires. As electronic devices become more multifunctional and highly integrated, the number of I/O terminals required may increase. As the number of I/O terminals increases, the wire bonding apparatus also increases to occupy a relatively large area. Therefore, there may be a limitation that many components may not be used in a circuit. Particularly, in the case of stacking heterogeneous semiconductor chips, there may be a need for a smaller and denser packaging method to obtain as much die space as possible.

For example, in the contemporary stacked semiconductor package, a plurality of semiconductor chips may sequentially be stacked on a circuit board through an adhesive film, and the connection pad of the semiconductor chip may be electrically connected to a portion of the circuit board through a bonding wire; and, after the formation of such a stacked structure, the plurality of semiconductor chips may be packaged in an insulating resin. In the structure in which flash memories are stacked, a plurality of memory chips may sequentially be stacked on a lead frame. At this time, it may be too long for the bonding wire to connect the lead frame to an electrode of a memory chip in an uppermost layer. Thus, the bonding wires may be subjected to a wire bonding process, or may be subjected to a connected rear sealing process such that the bonding wires are in contact with neighboring bonding wires at respective different potentials. From this point of view, a stacked memory device of wire bonding connection structure may not improve reliability and signal speed. Further, due to the spatial occupation of the wire bonding, the design range may be limited.

Meanwhile, the semiconductor package 100A according to an example may include the first structure 10A packaged such that the plurality of first semiconductor chips 121 to 124 stacked in a vertical direction are electrically connected to the first redistribution layers 142a and 142b through the connection vias 121v to 124v having different heights, and the second structure 10B packaged such that the second semiconductor chips 151 and 152 and the third semiconductor chip 153 are electrically connected to the second redistribution layers 172a and 172b. In this case, the first redistribution layers 142a and 142b and the second redistribution layers 172a and 172b may be electrically connected to each other through the electrical connection member 180 formed therebetween. For example, in an upper portion of the package 100A, since a plurality of stacked first semiconductor chips 121 to 124 may be redistributed by using the connection vias 121v to 124v having different heights, instead of wire bonding, a signal path to the first redistribution layers 142a and 142b may be minimized. Therefore, a signal loss may be reduced to improve the signal electric characteristics. In addition, since a thickness of the wire bonding need not be considered, more thin thickness is possible. Further, in a lower portion of the package 100A, the plurality of first semiconductor chips 121 to 124 and the homogeneous or heterogeneous second semiconductor chip 151 and 152 and the third semiconductor chip 153 may be redistributed to be electrically connected to the second redistribution layers 172a and 172b, and may provide an electrical connection path in a vertical direction through an electrical connection member 180 such as a plurality of through-vias 180. Therefore, although the different types of semiconductor chips 121 to 124 and 151 to 153 are implemented in one package 100A, the semiconductor chips 121 to 124 and 151 to 153 may be made thinner than the conventional ones, and the signal path may also be minimized.

Meanwhile, the semiconductor package 100A according to an exemplary embodiment may further include a frame 110 having a through-hole 110H in the first structure 10A. The frame 110 may impart rigidity to the package 100A, depending on a material constituting the frame. Therefore, the warpage of the package 100A may be more easily controlled, and reliability may be improved. In addition, reliability may be further improved by controlling the thickness uniformity of the first encapsulant 130.

The first encapsulant 130 may include a photo-sensable insulating material (photo imageable dielectric, PID). In this case, each of the connection vias 121v to 124v may be formed by forming a photo-via hole passing through the first encapsulant 130 by a photolithography method, and filling the hole with a metal material, such as copper (Cu), aluminum (Al), silver (Ag), tin (Sn), gold (Au), nickel (Ni), lead (Pb), titanium (Ti), or an alloy thereof. Therefore, damage to the connection pads 121P to 124P may be minimized, and finer pitch may be realized more accurately.

Meanwhile, adhesive films 121d to 124d such as a die attach film DAF may be disposed on the inactive surfaces of the first semiconductor chips 121 to 124, respectively. In first semiconductor chips 121 and 122, 122 and 123, or 123 and 124 each neighboring in a vertical direction among the plurality of first semiconductor chips 121 to 124, the inactive surface of the first semiconductor chip 121, 122, or 123 disposed in a lower portion may be attached to the active surface of the first semiconductor chip 122, 123, or 124 disposed in an upper portion, through an adhesive film 121d, 122d, or 123d. The reliability may be further improved by stacking the plurality of first semiconductor chips 121 to 124 using the adhesive films 121d to 124d.

Meanwhile, the upper surface of the adhesive film 124d disposed on the inactive surface of the first semiconductor chip 124 disposed on the uppermost one of the plurality of first semiconductor chips 121 to 124 may be substantially coplanar with the upper surface of the first encapsulant 130. The active surface of the first semiconductor chip 121 disposed on the lowermost one of the plurality of first semiconductor chips 121 to 124 may be physically spaced apart from the lower surface of the first encapsulant 130 by a predetermined distance. This may be configurational characteristics to be achieved by arranging a plurality of first semiconductor chips 121 to 124 in the through-holes 110H of the frame 110 and encapsulating the first semiconductor chips 121 to 124 with the first encapsulant 130 through the reverse process described in the process steps to be described later. A thickness of the first structure 10A in the upper portion of the package 100A may be made further thinner.

Each of the first semiconductor chips 121 to 124 may be a flash memory chip, each of the second semiconductor chips 151 and 152 may be a DRAM and the third semiconductor chip 153 may be a controller CTRL. For example, when the heterogeneous semiconductor chips 121 to 124, 151 to 152, and 153 are appropriately arranged and electrically connected in upper and lower portions of the package 100A, although a plurality of heterogeneous semiconductor chips 121 to 124, 151 to 152, and 153 are included therein, it may be possible to provide a semiconductor package 100A that may be further thinned, may be improved in performance, and may be highly reliable.

Hereinafter, each configuration included in the semiconductor package 100A according to one example will be described in more detail.

The frame 110 may improve the rigidity of the package 100A according to a specific material, and may play a role of ensuring uniformity of the thickness of the first encapsulant 130. The frame 110 may have a through-hole 110H, and a plurality of stacked first semiconductor chips 121 to 124 may be disposed in the through-hole 110H. The material of the frame 110 is not particularly limited. For example, an insulating material may be used. As the insulating material, a thermosetting resin such as an epoxy resin, a thermoplastic resin such as polyimide, or a resin such as glass fiber, glass cloth, glass fabric, etc., for example, prepreg, ABF (Ajinomoto Build-up Film), and the like may be used. If desired, the frame 110 may be omitted.

Each of the first semiconductor chips 121 to 124 may be an integrated circuit (IC) in which hundreds to millions of devices may be integrated into one chip. The integrated circuit of each of the first semiconductor chips 121 to 124 may be, for example, a flash memory chip, more specifically, a NAND type flash memory chip, but is not limited thereto. In the first semiconductor chips 121 to 124, surfaces on which the connection pads 121P to 124P are disposed become active surfaces, and surfaces opposite thereto become inactive surfaces, respectively. The first semiconductor chips 121 to 124 may be formed on the basis of an active wafer. In this case, silicon (Si), germanium (Ge), gallium arsenide (GaAs), or the like may be used as a base material of each body. The body may have various circuits formed. The connection pads 121P to 124P may be for electrically connecting the first semiconductor chips 121 to 124 to other components, respectively. Metal materials such as aluminum (Al) may be used as a forming material without any particular limitation. A passivation film (not illustrated) may be formed on the body to expose the connection pads 121P to 124P. A passivation film (not illustrated) may be an oxide film or a nitride film, or may be a double layer of an oxide film and a nitride film. An insulation film (not illustrated) or the like may be further disposed at a necessary position.

The first semiconductor chips 121 to 124 may be stacked to have a stepped shape such that the connection pads 121P to 124P are exposed. The connection pads 121P to 124P of the first semiconductor chips 121 to 124 may penetrate into the first encapsulant 130, and may be connected to the uppermost first redistribution layer 142a in the first redistribution layers 142a and 142b of the first connection member 140 through the connection vias 121v to 124v having different heights. The adhesive films 121d to 124d may be disposed on the inactive surfaces of the first semiconductor chips 121 to 124, respectively. The first semiconductor chips 121 and 122, 122 and 123, or 123 and 124 arranged in a vertical direction may be attached to each other through the adhesive films 121d, 122d, or 122d. More specifically, the inactive surface of the first semiconductor chip 121, 122, or 123 disposed in a lower portion may be attached to the active surface of the first semiconductor chip 122, 123, or 124 disposed in an upper portion, through an adhesive film 121d, 122d, or 123d. The reliability may be further improved by stacking the plurality of first semiconductor chips 121 to 124 using the adhesive films 121d to 124d. Each of the adhesive films 121d to 124d may be a known die attach film (DAF), and the material thereof is not particularly limited.

The first encapsulant 130 may encapsulate the first semiconductor chips 121 to 124, respectively. Further, at least a portion of the through-hole 110H may be filled with the first encapsulant 130. The first encapsulant 130 may include an insulating material. As the insulating material, a photosensitive insulating material (PID) may be used as described above. In this case, each of the connection vias 121v to 124v may be formed by forming a photo-via hole penetrating into the first encapsulant 130 by a photolithography method, and then filling the photo-via hole with a metal material, such as copper (Cu), aluminum (Al), silver (Ag), tin (Sn), gold (Au), nickel (Ni), lead (Pb), titanium (Ti), or an alloy thereof. Therefore, damage to the connection pads 121P to 124P may be minimized, and finer pitch may be realized more accurately.

If necessary, a material including an inorganic filler and an insulating resin such as a thermosetting resin such as an epoxy resin, a thermoplastic resin such as polyimide, or a resin such as glass fiber, glass cloth, glass fabric, etc., for example, prepreg, ABF (Ajinomoto Build-up Film), and the like may be used.

The first connection member 140 may redistribute the connection pads 121P to 124P of the plurality of stacked first semiconductor chips 121 to 124, respectively. The first connection member 140 may include a first insulation layer 141, first redistribution layers 142a and 142b, and first redistribution vias 143a and 143b. More specifically, the first connection member 140 may include a 1-1 redistribution layer 142a disposed on the lower surface of the first encapsulant 130; a 1-1 redistribution via 143a penetrating into the first encapsulant 130 and connecting the respective connecting pads 121P to 124P to the 1-1 redistribution layer 142a; a first insulation layer 141 disposed on the lower surface of the first encapsulant 130 and covering the 1-1 redistribution layer 142a; a 1-2 redistribution layer 142b disposed on the lower surface of the first insulation layer 141; and a 1-2 redistribution via 143b passing through the first insulation layer 141 and electrically connecting the 1-1 redistribution layer 142a and the 1-2 redistribution layers 142b. The first insulation layer 141, the 1-2 redistribution layer 142b, and the 1-2 redistribution via 143b may be formed in a larger number of layers. The first insulation layer 141, the 1-2 redistribution layer 142b, and the 1-2 redistribution via 143b may be modified in different forms from those of the first embodiment.

A photosensitive insulating material (PID) may be used as the first insulation layer 141. In this case, a fine pitch may be introduced through the photo via. The present disclosure is not limited thereto, and if necessary, a non-photosensitive insulation film such as ABF may be used. When the first insulation layer 141 is composed of a plurality of layers, they may include the same material or may include materials different from each other. For example, a lowermost layer may be a non-photosensitive insulation film such as ABF, and the other layer may be a photosensitive insulation film such as PID. The present disclosure is not limited thereto.

The first redistribution layers 142a and 142b may substantially redistribute the connection pads 121P to 124P of the stacked first semiconductor chips 121 to 124, respectively. The first redistribution layers 142a and 142b may include a 1-1 redistribution layer 142a and a 1-2 redistribution layer 142b, respectively. These may be metal materials, such as copper (Cu), aluminum (Al), silver (Ag), tin (Sn), gold (Au), nickel (Ni), lead (Pb), titanium (Ti), or an alloy thereof. The 1-1 redistribution layer 142a may be integrated with the 1-1 redistribution via 143a. The 1-2 redistribution layer 142b may be integrated with the 1-2 redistribution via 143b. The 1-1 redistribution layer 142a and the 1-2 redistribution layer 142b may perform various functions according to design. For example, a ground (GND) pattern, a power (PWR) pattern, a signal (S) pattern, and the like may be included. The signal S pattern may include various signals except for a ground (GND) pattern, a power (PWR) pattern, for example, a data signal, and the like. Also, via pads, electrical connection structure pads, and the like may be included.

The first redistribution vias 143a and 143b may substantially redistribute the connection pads 121P to 124P of the plurality of stacked first semiconductor chips 121 to 124 together with the first redistribution layers 142a and 142b. The first redistribution vias 143a and 143b may include the first redistribution via 143a and the first redistribution via 143b. These may be metal materials, such as copper (Cu), aluminum (Al), silver (Ag), tin (Sn), gold (Au), nickel (Ni), lead (Pb), titanium (Ti), or an alloy thereof. The 1-1 redistribution via 143a may include a plurality of connection vias 121v to 124v as described above. The plurality of connection vias 121v to 124v may have different heights from each other. The larger the height, the larger the average diameter. Each of the connection vias 121v to 124v may be formed by using a photolithography method to form a photo-via hole penetrating into the first encapsulant 130 and then filling a photo-via hole with a metal material, such as copper (Cu), aluminum (Al), silver (Ag), tin (Sn), gold (Au), nickel (Ni), lead (Pb), titanium (Ti), or an alloy thereof. Each of the connection vias 121v to 124v may be a filled-type via filled with a metal material. Each of the connection vias 121v to 124v may have a tapered shape of which diameter on a lower side may be greater than diameter on an upper side. Likewise, the 2-2 redistribution via 143b may also be fill-type via filled with a metal material, and may have a tapered shape of which diameter on a lower side may be greater than diameter on an upper side.

The second semiconductor chips 151 and 152 may also be an integrated circuit (IC) in which hundreds to millions of devices may be integrated into one chip. The integrated circuit of each of the second semiconductor chips 151 and 152 may be, for example, a DRAM memory chip, but is not limited thereto. In the second semiconductor chips 151 and 152, surfaces on which the connection pads 151P and 152P are disposed become active surfaces, and surfaces opposite thereto become inactive surfaces. The second semiconductor chips 151 and 152 may also be formed on the basis of an active wafer. In this case, silicon (Si), germanium (Ge), gallium arsenide (GaAs), or the like may be used as a base material of each body. The body may have various circuits formed. The connection pads 151P and 152P may be for electrically connecting the second semiconductor chips 151 and 152 with other components, respectively. Metal materials such as aluminum (Al) may be used as a forming material without any particular limitation. A passivation film (not illustrated) may be formed on the body to expose the connection pads 151P and 152P. A passivation film (not illustrated) may be an oxide film or a nitride film, or may be a double layer of an oxide film and a nitride film. An insulation film (not illustrated) or the like may be further disposed at a necessary position.

The third semiconductor chip 153 may also be an integrated circuit (IC) in which hundreds to millions of devices may be integrated into one chip. The integrated circuit of the third semiconductor chip 153 may be, for example, a controller (CTRL) chip, but is not limited thereto. In the third semiconductor chip 153, a surface on which the connection pad 153P is disposed becomes an active surface, and a surface on the opposite side thereto becomes an inactive surface. The third semiconductor chip 153 may also be formed on the basis of an active wafer. In this case, silicon (Si), germanium (Ge), gallium arsenide (GaAs), or the like may be used as a base material of each body. The body may have various circuits formed. The connection pad 153P may be for electrically connecting the third semiconductor chip 153 to other components. A metal material such as aluminum (Al) may be used as a forming material without any particular limitation. A passivation film (not illustrated) may be formed on the body to expose the connection pad 153P. A passivation film (not illustrated) may be an oxide film, a nitride film, or a double layer of an oxide film and a nitride film. An insulation film (not illustrated) or the like may be further disposed at a necessary position.

The second encapsulant 160 may include an insulating material. Examples of the insulating material may include a resin including an inorganic filler and an insulating resin, for example, a thermosetting resin such as an epoxy resin, a thermoplastic resin such as polyimide, or a resin containing a reinforcing material such as an inorganic filler, specifically ABF, FR-4, BT, PID resin, etc. may be used. A known molding material such as EMC may be used. If desired, a thermosetting resin or thermoplastic resin may be impregnated with a core material such as inorganic filler and/or glass fiber, glass cloth, glass fabric, or the like.

The second connection member 170 may redistribute the connection pads 151P to 153P of the second semiconductor chips 151 and 152 and the third semiconductor chip 153, and may electrically connect them. The second connection member 170 may include second insulation layers 171a and 171b, second redistribution layers 172a and 172b, and second redistribution vias 173a and 173b. More specifically, the second connection member 170 may include a 2-1 insulation layer 171a; a 2-1 redistribution layer 172a disposed on a lower surface of the 2-1 insulation layer 171a; a 2-1 redistribution via 173a passing through the first insulation layer 171a and electrically connecting the 2-1 redistribution layer 172a to the connection pads 151P to 153P and the electrical connection member 180; a 2-2 insulation layer 171b disposed on a lower surface of the 2-1 insulation layer 171a and covering the 2-1 redistribution layer 172a; a 2-2 redistribution layer 172b disposed on a lower surface of the 2-2 insulation layer 171b; and a 2-2 redistribution via 173b passing through the 2-2 insulation layer 171b and electrically connecting the 2-1 redistribution layer 172a to the 2-2 redistribution layer 172b. Each of these may be composed of more layers than one, and may be modified into a form different from the drawing.

As the material of the second insulation layers 171a and 171b, an insulating material may be used. As the insulating material, PID, ABF, etc. may be used. The second insulation layers 171a and 171b may include a 2-1 insulation layer 171a and a 2-2 insulation layer 171b, and they may include the same material or different materials. For example, the 2-2 insulation layer 171a may include PID, and the 2-2 insulation layer 171b may include ABF. The present disclosure is not limited thereto.

The second redistribution layers 172a and 172b may substantially redistribute the connection pads 151P to 153P of the second semiconductor chips 151 and 152 and the third semiconductor chip 153. Metal materials, such as copper (Cu), aluminum (Al), silver (Ag), tin (Sn), gold (Au), nickel (Ni), lead (Pb), titanium (Ti), or an alloy thereof, may be used as the forming material. The second redistribution layers 172a and 172b may include a 2-1 redistribution layer 172a and a 2-2 redistribution layer 172b, which may perform various functions according to the design of the corresponding layer. For example, a ground (GND) pattern, a power (PWR) pattern, a signal (S) pattern, and the like may be included. The signal S pattern may include various signals except for a ground (GND) pattern, a power (PWR) pattern, for example, a data signal, and the like. Also, via pads, electrical connection structure pads, and the like may be included. The 2-1 redistribution layer 172a may be integrated with the 2-1 redistribution via 173a. The 2-2 redistribution layer 172b may be integrated with the 2-2 redistribution via 173b. An under-bump metallurgy (UBM) may be formed by integrating the 2-2 redistribution layer 172b and the 2-2 redistribution via 173b.

The second redistribution vias 173a and 173b may electrically connect the electrical connection member 180, the connection pads 151P to 153P, and the second redistribution layers 172a and 172b, which are formed on different layers. The second redistribution via 173a and 173b may include a 2-1 redistribution via 173a and a 2-2 redistribution via 173b, which may include a metal material, such as copper (Cu), aluminum (Al), silver (Ag), tin (Sn), gold (Au), nickel (Ni), lead (Pb), titanium (Ti), or an alloy thereof, respectively. The 2-1 redistribution via 173a and the 2-2 redistribution via 173b may be fill-typed via filled with a metal material, respectively, and may have a tapered shape of which diameter on a lower side may be greater than diameter on an upper side. The overall size, such as the height and diameter, of the 2-2 redistribution via 173b may be greater than the overall size of the 2-1 redistribution via 173a.

The electrical connection member 180 may electrically connect the first connection member 140 and the second connection member 170 to provide an electrical path between the first structure 10A and the second structure 10B in the package 100A. In one example, the electrical connection member 180 may include a plurality of through-vias 180. Each of the through-vias 180 may pass through the second encapsulant 160, and may be formed of a metal material, such as copper (Cu), aluminum (Al), silver (Ag), tin (Sn), gold (Au), nickel (Ni), lead (Pb), titanium (Ti), or an alloy thereof. The plurality of through-vias 180 may be formed by a plating operation, after forming a via hole, but is not limited thereto, and may be those in which a metal post may be formed.

The electrical connection structure 190 may be a structure for physically and/or electrically connecting the semiconductor package 100A to an external source. For example, the semiconductor package 100A may be mounted on the main board of the electronic device through the electrical connection structure 190. The electrical connection structure 190 may be composed of a low melting point metal, for example, tin (Sn), or an alloy containing tin (Sn). More specifically, it may be formed of a solder or the like, but this may be merely an example, and the material is not particularly limited thereto. The electrical connection structure 190 may be a land, a ball, a pin, or the like. The electrical connection structure 190 may be formed of multiple layers or a single layer. In the case of a multi-layered structure, it may include a copper pillar and a solder. In the case of a single layer, tin-silver solder or copper may be included, but this may be merely an example, and is not limited thereto. The number, spacing, arrangement type, etc. of the electrical connection structures 190 are not particularly limited, and may be sufficiently modified according to design specifications for a person skilled in the art.

At least one of the electrical connection structures 190 may be disposed in a fan-out area. The fan-out area may be an area outside an area in which the semiconductor chips 121 to 124 and 151 to 153 are disposed. The fan-out package may be more reliable than a fan-in package, may have many I/O terminals, and may facilitate 3D interconnection. In addition, a package having a thinner thickness than ball grid array (BGA) package, land grid array (LGA) package, and the like, may be manufactured and may be excellent in price competitiveness.

Figure 10:
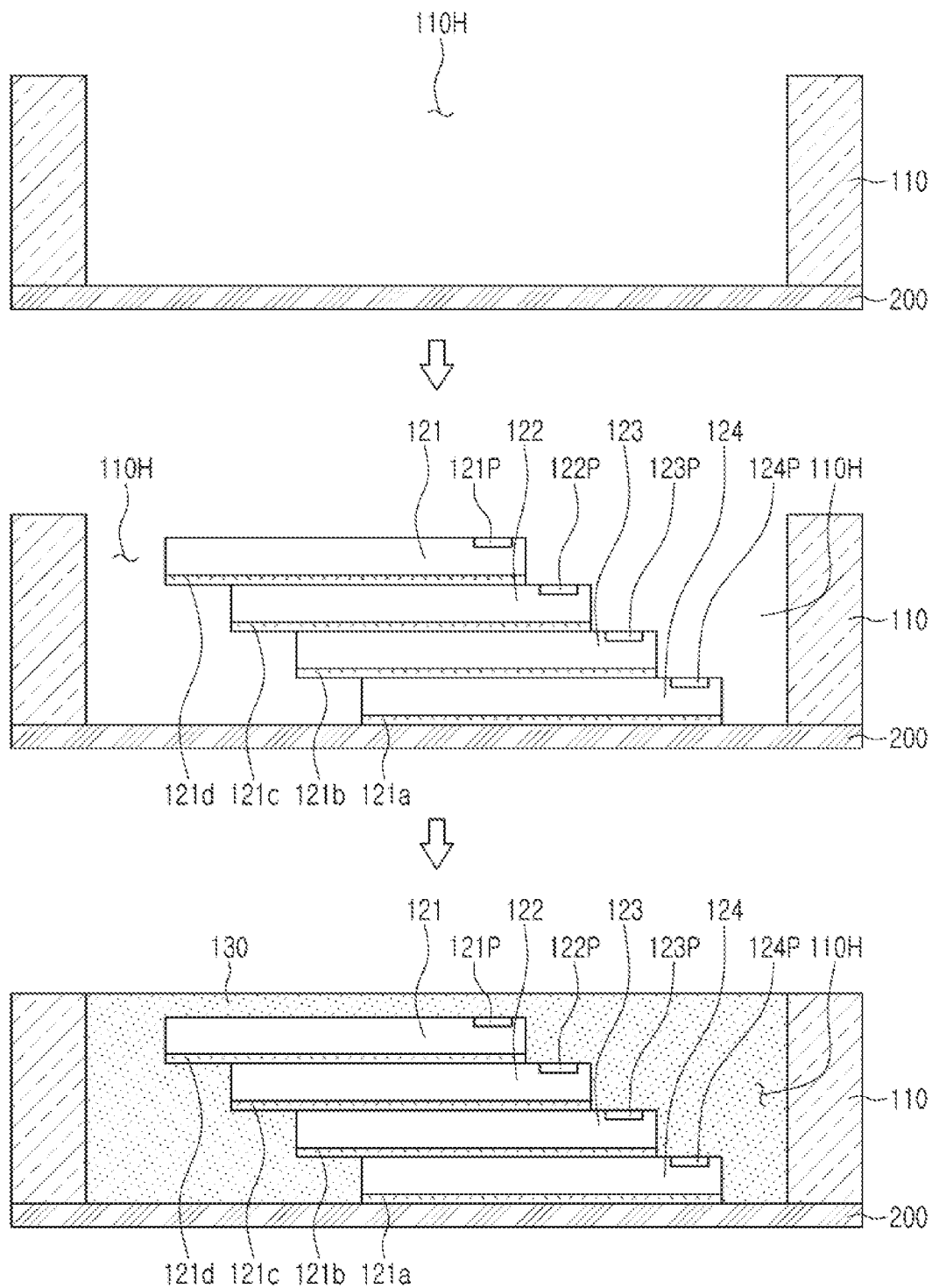
FIGS. 10 and 11 are schematic views illustrating an exemplary manufacturing procedure of the semiconductor package of FIG. 9.
Figure 11:
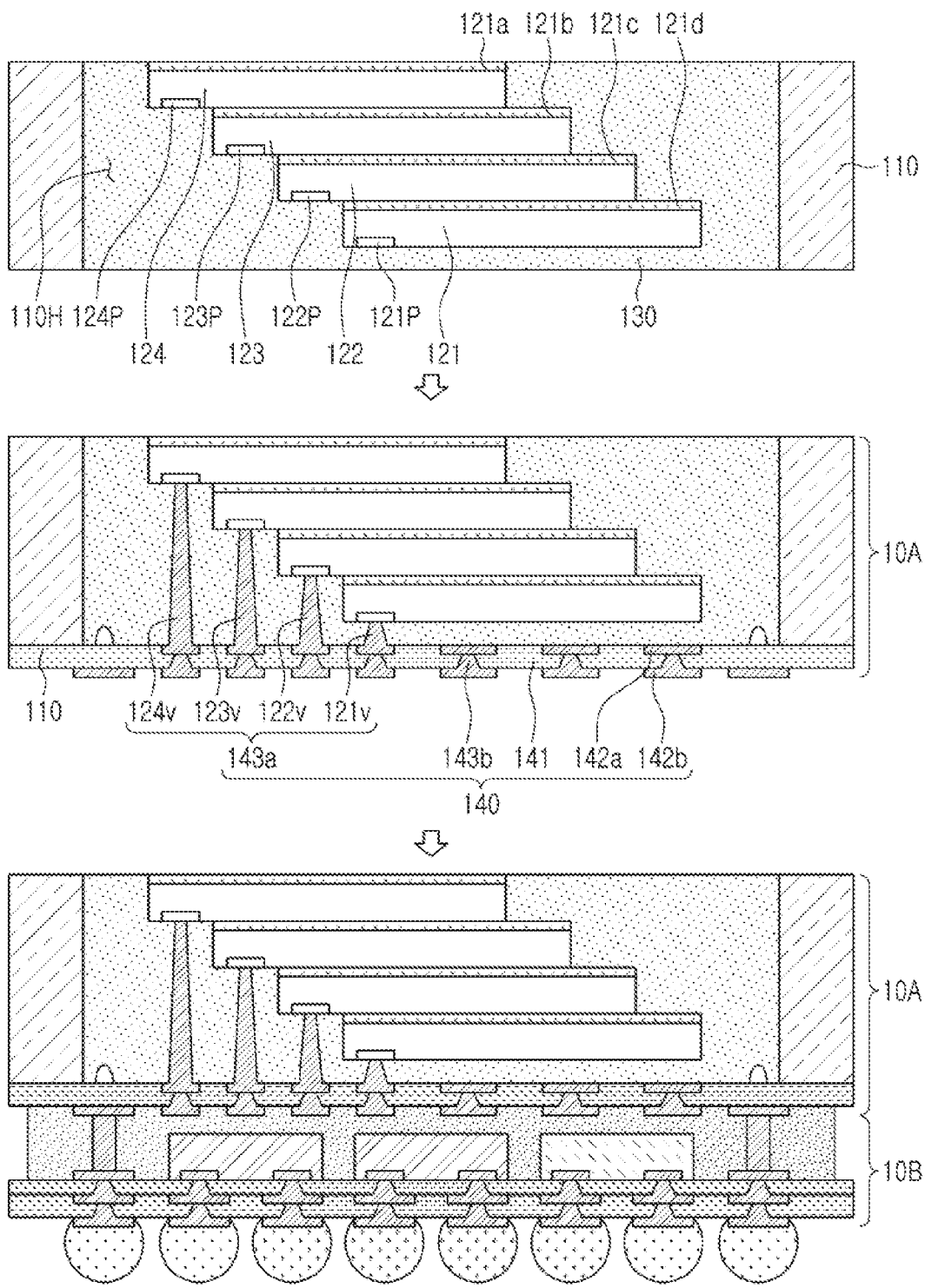

FIGS. 10 and 11 are schematic views illustrating an exemplary manufacturing procedure of the semiconductor package of FIG. 9.

Referring to FIG. 10, first, a frame 110 having a through-hole 110H may be attached on a tape 200. Next, a plurality of first semiconductor chips 121 to 124 stacked on the tape 200 exposed through the through-hole 110H with the adhesive films 121d to 124d may be connected in a reverse state such that the active surface on which the respective connection pads 121P to 124P are disposed faces in an upward direction. Next, the plurality of first semiconductor chips 121 to 124 may be encapsulated using a photosensitive insulation film (PID).

Referring to FIG. 11, the tape 200 may be removed, and the prepared intermediate an active surface on which the connection pads 121P to 124P of each of the stacked first semiconductor chips 121 to 124 are disposed faces in a downward direction may be reversed. Next, a plurality of photo-via holes may be formed by the exposure and development process, and a 1-1 redistribution via 143a composed of a plurality of connection vias 121v to 124v, and a 1-2 insulation layer 141b may be formed by a process filling using a plating operation. A first insulation layer 141 may be formed by a lamination or coating process, a via hole may be formed, and then a plating material may be formed on the first insulation layer 141 and fill the via hole, to form a 1-2 redistribution via 143b and a 1-2 redistribution layer 142b. A first structure 10A may be formed by a series of processes. Next, a second structure 10B may be formed in a position lower than a position of the first structure 10A, and the electrical connection structure 190 may be formed.

Figure 12:
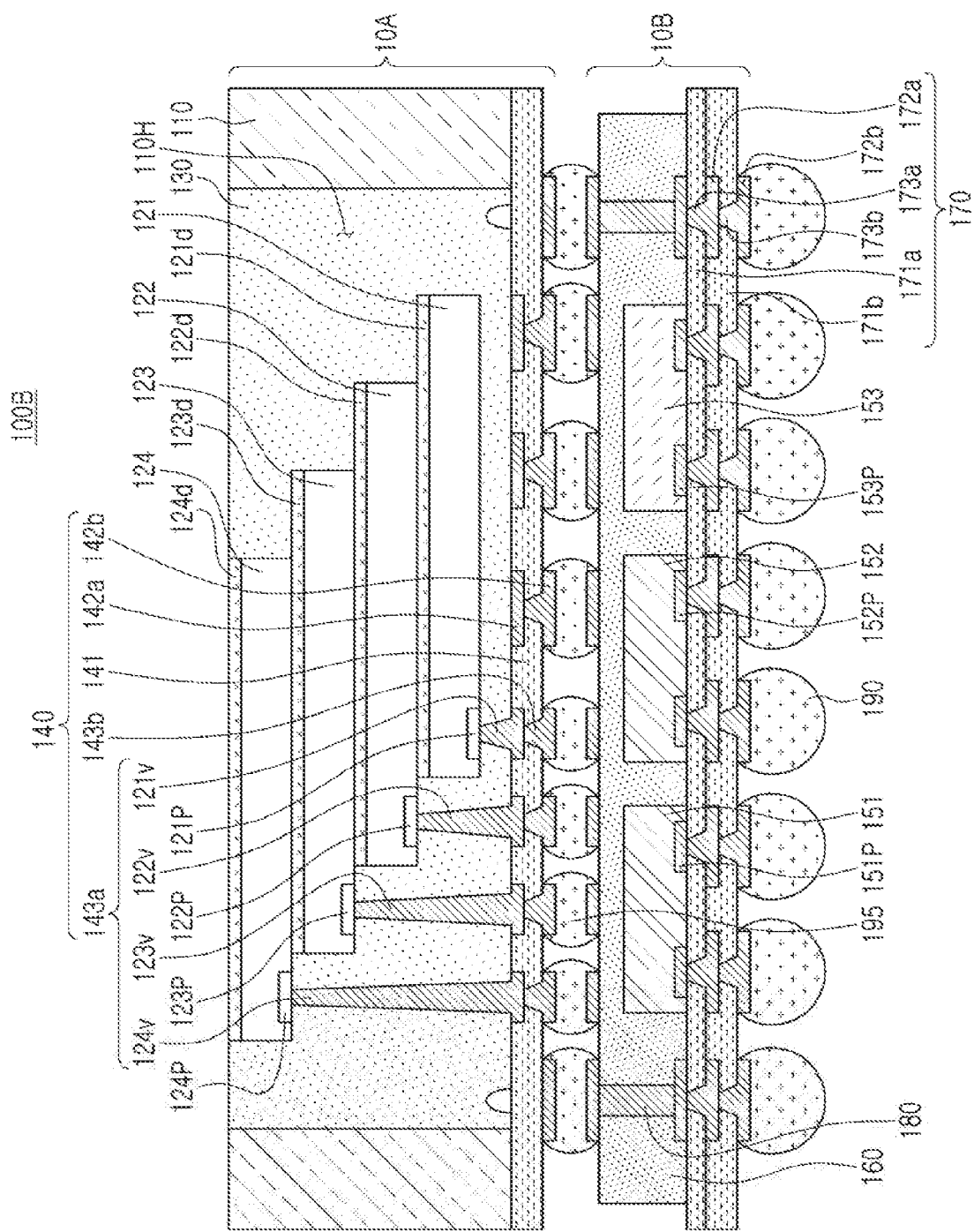
FIG. 12 is a schematic cross-sectional view illustrating another example of a semiconductor package.

FIG. 12 is a schematic cross-sectional view illustrating another example of a semiconductor package.

Referring to FIG. 12, in a semiconductor package 100B according to another example, a first structure 10A and a second structure 10B may be spaced away from each other by a predetermined distance, and a plurality of electrical connection structures 195 may be disposed therebetween for an electrical connection thereof. For example, a semiconductor package 100B according to another example may have a form of a package on package (POP). An electrical connection member 180, such as a plurality of through-vias 180, may be electrically connected to first redistribution layers 142a and 142b of a first connection member 140 through a plurality of electrical connection structures 195, and may also be electrically connected to a plurality of first semiconductor chips 121 to 124.

The electrical connection structure 195 may be composed of a low melting point metal, for example, tin (Sn), or an alloy containing tin (Sn), respectively. More specifically, it may be formed of a solder or the like, but this may be merely an example, and the material is not particularly limited thereto. The electrical connection structure 195 may be a land, a ball, a pin, or the like. The electrical connection structure 195 may be formed of multiple layers or a single layer. In the case of a multi-layered structure, it may include a copper pillar and a solder. In the case of a single layer, tin-silver solder or copper may be included, but this may be merely an example, and is not limited thereto. The number, spacing, arrangement type, etc. of the electrical connection structures 195 are not particularly limited, and may be sufficiently modified according to design specifications for a person skilled in the art.

Other configurations may be substantially the same as those described above, and a detailed description thereof will be omitted.

Figure 13:
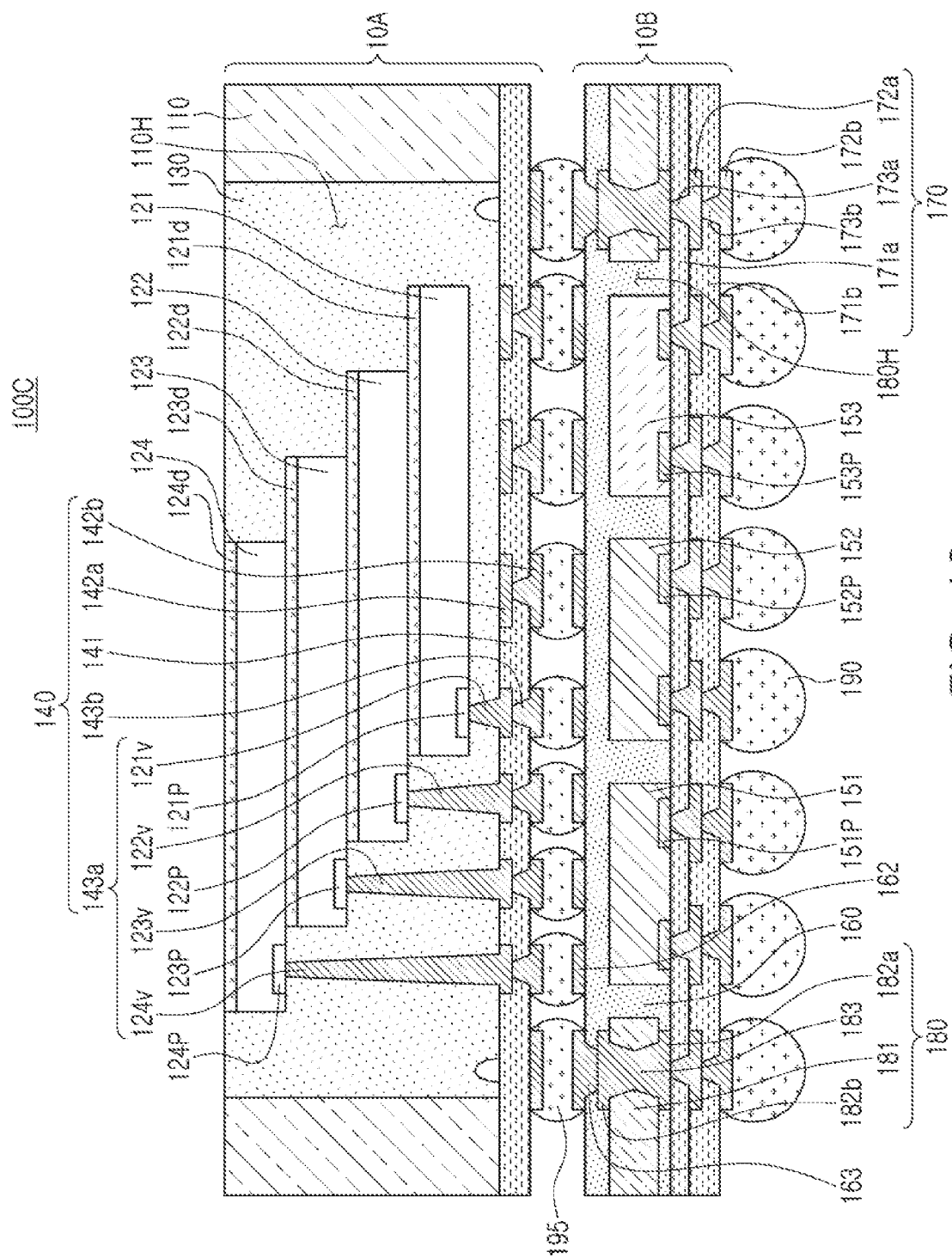
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according to another example, a second structure 10B may include a frame 180, an electrical connection member 180, having a through-hole 180H, and including a plurality of wiring layers 182*a* and 182*b* and one or more layers of wiring via 183 for electrically connecting the plurality of wiring layers 182*a* and 182*b*. Second semiconductor chips 151 and 152 and a third semiconductor chip 153 may be arranged side by side in the through-hole 180H of the frame 180. A second encapsulant 160 may fill at least a portion of the through-hole 180H of the frame 180. Due to the frame 180, the second structure 10B may also have better rigidity, and the thickness uniformity of the second encapsulant 160 may be ensured.

The frame 180 may include an insulation layer 181, a first wiring layer 182*a* disposed on a lower surface of the insulation layer 181, a second wiring layer 182*b* disposed on an upper surface of the insulation layer 181, and a wiring via 183 which passes through the first wiring layer 181 and electrically connects the first and second wiring layers 182*a* and 182*b*. The first and second wiring layers 182*a* and 182*b* may be electrically connected to the first and second redistribution layers 142*a*, 142*b*, 172*a*, and 172*b* of the first and second connection members 140 and 170, respectively.

A material of the insulation layer 181 is not particularly limited. For example, an insulating material may be used. As the insulating material, a thermosetting resin such as an epoxy resin, a thermoplastic resin such as polyimide, or a resin impregnated with a core material such as an inorganic filler and/or a glass fiber, glass cloth, glass fabric, or the like, for example, a prepreg may be used.

The wiring layers 112*a* and 112*b* may be formed of metal materials, such as copper (Cu), aluminum (Al), silver (Ag), tin (Sn), gold (Au), nickel (Ni), lead (Pb), titanium (Ti), or an alloy thereof. The wiring layers 112*a* and 112*b* may perform various functions according to the design of the layer. For example, it may include a ground (GND) pattern, a power (PWR) pattern, a signal (S) pattern, and the like. The signal S pattern may include various signals except for a ground (GND) pattern, a power (PWR) pattern, for example, a data signal, and the like. Also, via pads, electrical connection structure pads, and the like may be included. The wiring layers 112*a* and 112*b* may be formed by a known plating process, and may be composed of a seed layer and a conductor layer, respectively. Depending on the process, a thickness of the wiring layers 182*a* and 182*b* may be thicker than a thickness of the redistribution layers 142*a*, 142*b*, 172*a*, and 172*b*.

The wiring via 113 may electrically connect the wiring layers 112*a* and 112*b* formed in different layers, thereby forming an electrical path in the frame 180. The wiring via 113 may also be formed of a metal material, such as copper (Cu), aluminum (Al), silver (Ag), tin (Sn), gold (Au), nickel (Ni), lead (Pb), titanium (Ti), or an alloy thereof. The wiring via 113 may be fill-type through-vias filled with a metal material, and may have an hourglass shape. The wiring via 113 may also be formed by a known plating process, and may be composed of a seed layer and a conductor layer, respectively.

A backside wiring layer 162 may be disposed on the second encapsulant 160 as needed, and the backside wiring layer 162 may be electrically connected to the plurality of wiring layers 182*a* and 182*b* of the frame 180 through a backside via 163 passing through the second encapsulant 160. The backside wiring layer 160 may be electrically connected to the redistribution layers 142*a* and 142*b* of the first connection member 140 through the electrical connection structure 195. The backside metal layer 162 and the backside via 163 may be also formed of a metal material, such as copper (Cu), aluminum (Al), silver (Ag), tin (Sn), gold (Au), nickel (Ni), lead (Pb), titanium (Ti), or an alloy thereof, and they may be integrated.

Other configurations may be substantially the same as those described above, and a detailed description thereof will be omitted.

Figure 14:
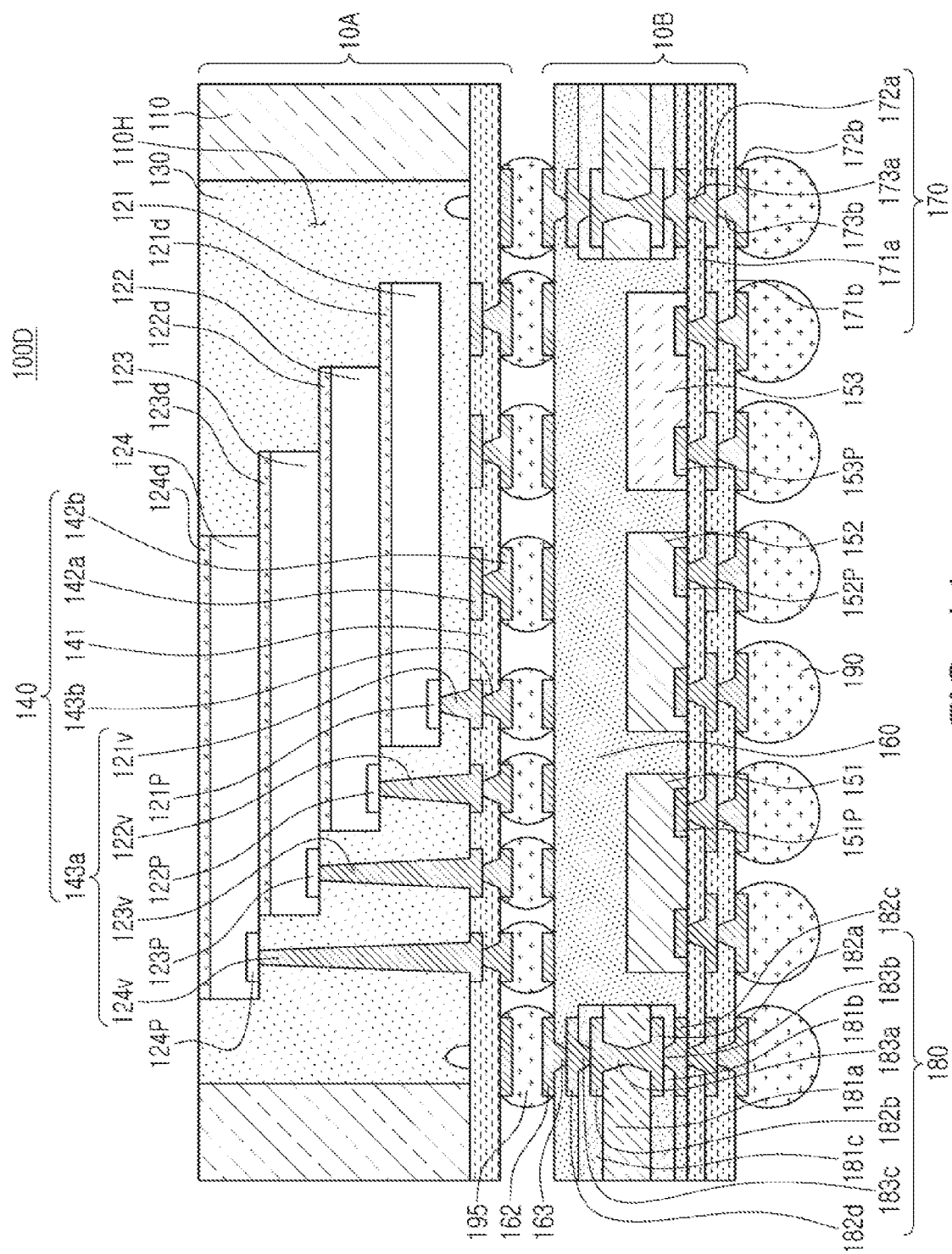
FIG. 14 is a schematic cross-sectional view illustrating another example of a semiconductor package.

FIG. 14 is a schematic cross-sectional view illustrating another example of a semiconductor package.

Referring to FIG. 14, in a semiconductor package 100D according to another example, a second structure 10B may include a frame 180, an electrical connection member 180, having a through-hole 180H, and including a plurality of wiring layers 182*a* to 182*d*, and a plurality of wiring vias 183*a* to 183*c* electrically connecting the plurality of wiring layers 182*a* to 182*d*. Since the frame 180 may include a greater number of wiring layers 182*a* to 182*d*, the second connection member 170 may be further simplified.

The frame 180 may include a first insulation layer 181*a*, a first wiring layer 182*a* disposed on a lower surface of the first insulation layer 181*a*, a second wiring layer 182*b* disposed on an upper surface of the first insulation layer 181*a*, a first wiring via 183*a* passing through the first insulation layer 181*a* and electrically connecting the first and second wiring layers 182*a* and 182*b*, a second insulation layer 181*b* disposed on a lower surface of the first insulation layer 181*a* and covering the first wiring layer 182*a*, a third wiring layer 182*c* disposed on a lower surface of the second insulation layer 181*b*, a second wiring via 183*b* passing through the second insulation layer 181*b* and electrically connecting the first and third wiring layers 182*a* and 182*c*, a third insulation layer 181*c* disposed on an upper surface of the first insulation layer 181*a* and covering the second wiring layer 182*b*, a fourth wiring layer 182*d* disposed on an upper surface of the third insulation layer 181*c*, and a third wiring via 183*c* passing through the third insulation layer 181*c* and electrically connecting the second and fourth wiring layers 182*b* and 182*d*. The first to fourth wiring layers 182*a* to 182*d* may be electrically connected to the first and second redistribution layers 142*a*, 142*b*, 172*a* and 172*b* of the first and second connection members 140 and 170.

The first insulation layer 181*a* may be thicker than the second insulation layer 181*b* and the third insulation layer 181*c*. The first insulation layer 181*a* may be relatively thick to maintain rigidity, and the second insulation layer 181*b* and the third insulation layer 181*c* may be introduced to form a greater number of wiring layers 182*c* and 182*d*. The first insulation layer 181*a* may include an insulating material different from the second insulation layer 181*b* and the third insulation layer 181*c*. For example, the first insulation layer 181*a* may be, for example, a prepreg including a core material, a filler, and an insulating resin, and the second insulation layer 181*b* and the third insulation layer 181*c* may be ABF or PID comprising filler and an insulating resin, but is not limited thereto. In a similar manner, the first wiring via 183a passing through the first insulation layer 181a may have a diameter larger than the second and third wiring vias 183b and 183c passing through the second and third insulation layers 181b and 181c. Similarly, depending on a process, thicknesses of the wiring layers 182a to 182d may be thicker than thicknesses of the redistribution layers 142a, 142b, 172a, and 172b.

Other configurations may be substantially the same as those described above, and a detailed description thereof will be omitted.

Figure 15:
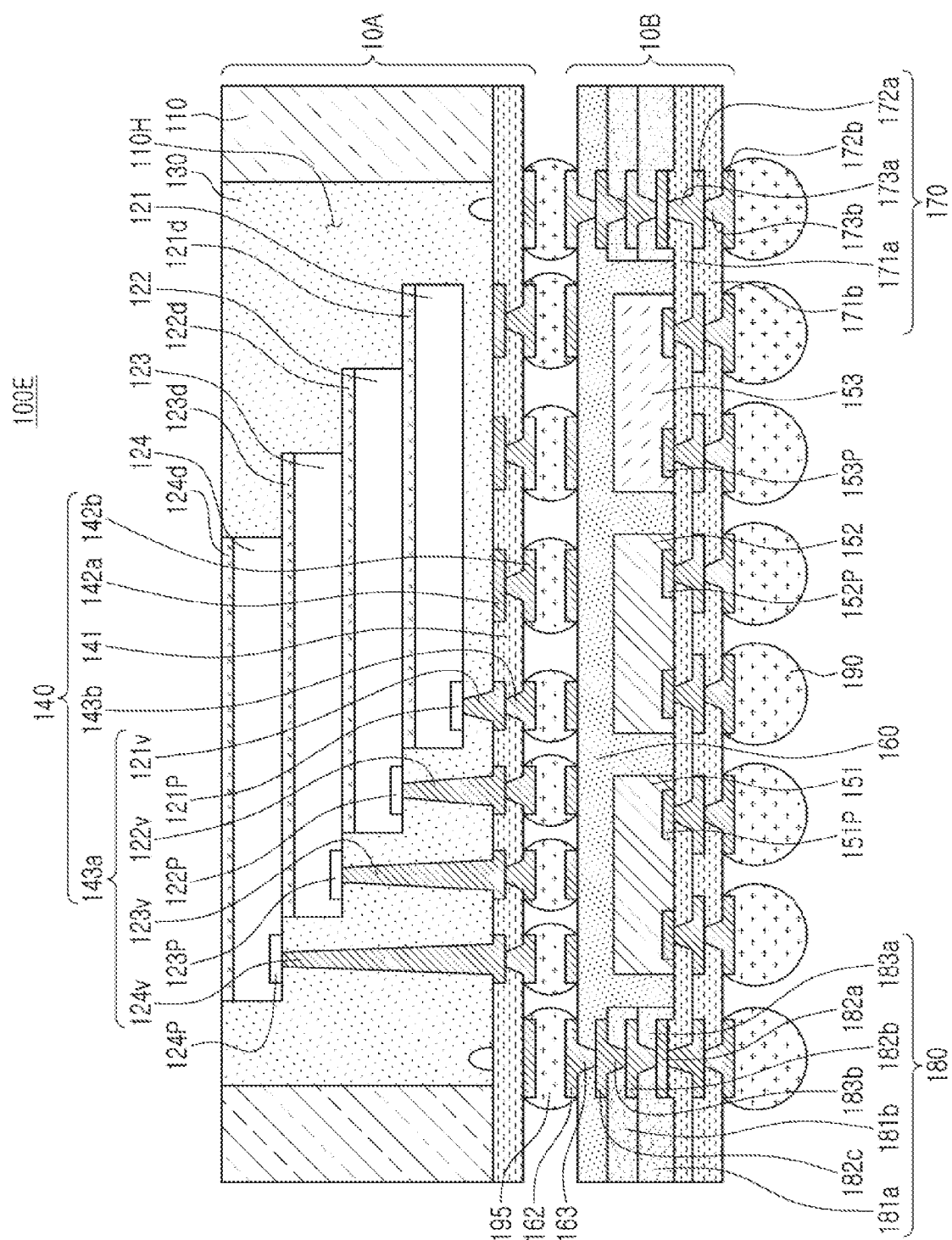
FIG. 15 is a schematic cross-sectional view illustrating another example of a semiconductor package.

FIG. 15 is a schematic cross-sectional view illustrating another example of a semiconductor package.

Referring to FIG. 15, in a semiconductor package 100E according to another example, a second structure 10B may include a frame 180, an electrical connection member 180, having a through-hole 180H, and including a plurality of wiring layers 182a to 182c, and a plurality of wiring vias 183a and 183b electrically connecting the plurality of wiring layers 182a to 182c. Since the frame 180 may similarly include a larger number of wiring layers 182a to 182c, the second connection member 140 may be further simplified.

The frame may include a first insulation layer 181a, a first wiring layer 182a embedded in the first insulation layer 181a such that a lower surface of the first insulation layer 181a is exposed, a second wiring layer 182b disposed on an upper surface of the first insulation layer 181a, a second insulation layer 181b disposed on an upper surface of the first insulation layer 181a and covering the second wiring layer 182b, a first wiring via 183a passing through the first insulation layer 181a and electrically connecting the first and second wiring layers 182a and 182b, a third wiring layer 182c disposed on an upper surface of the second insulation layer 181b, and a second wiring via 183b passing through the second insulation layer 181b and electrically connecting the second and third wiring layers 182b and 182c. The first to third wiring layers 182a to 182c may be electrically connected to the first and second redistribution layers 142a, 142b, 172a, and 172b of the first and second connection members 140 and 170.

The first wiring layer 182a may be recessed into the first insulation layer 181a. In this way, when the first wiring layer 182a is recessed into the first insulation layer 181a to have a step difference between the lower surface of the first insulation layer 181a and the lower surface of the first wiring layer 182a, it is possible to prevent the material forming the second sealing material 160 from bleeding to contaminate the first wiring layer 182a. Depending on a process, thicknesses of the wiring layers 182a to 182c may be thicker than thicknesses of the redistribution layers 142a, 142b, 172a, and 172b.

The material of the insulation layers 181a and 181b is not particularly limited. For example, an insulating material may be used. As the insulating material, a thermosetting resin such as an epoxy resin, a thermoplastic resin such as polyimide, or a resin in which these resins may be mixed with an inorganic filler, for example, ABF (Ajinomoto Build-up Film) may be used. If desired, photo-sensable insulating (photo imageable dielectric, PID) resin may also be used.

A portion of the pads of the first wiring layer 182a may serve as a stopper, when holes for the first wiring via 183a are formed. The first wiring via 183a may be advantageous in terms of the process in a case that a width of the upper surface thereof in a taper shape is wider than a width the lower surface thereof. In this case, the first wiring via 183a may be integrated with the pad pattern of the second wiring layer 182b. In addition, when forming the holes for the second wiring via 183b, a portion of the pads of the second wiring layer 182b may serve as a stopper. The second wiring via 183b may be advantageous in terms of the process in a case that a width of the upper surface thereof in a taper shape is wider than a width the lower surface thereof. In this case, the second wiring via 183b may be integrated with the pad pattern of the third wiring layer 182c.

The frame 110 of the semiconductor package 100E described in the various examples of the semiconductor packages 100A, 100B, 100C, and 100D may be applied. Other configurations may be substantially the same as those described above, and a detailed description thereof will be omitted.

Other configurations may be substantially the same as those described above, and a detailed description thereof will be omitted.

In the present disclosure, the lower side, the lower portion, the lower surface, and the like, refer to the downward direction with respect to the cross section of the drawing for convenience, and the upper side, the upper portion, the upper surface, and the like mean the opposite direction. It should be understood, however, that the scope of the claims is not particularly limited by the description of such directions, and the concept of the up/down may be changed at any time.

The meaning of being connected in the present disclosure may be not only a direct connection but also a concept including indirect connection through an adhesive layer or the like. In addition, the term "electrically connected" means a concept including both a physical connection and a non-connection. Further, the first, second, etc. expressions may be used to distinguish one component from another, and do not limit the order and/or importance of the components. In some cases, without departing from the scope of the right, the first component may be referred to as a second component, and similarly, the second component may be referred to as a first component.

The expression exemplary used in this disclosure does not mean the same embodiment but may be provided for emphasizing and explaining different unique features. However, the above-mentioned examples do not exclude that they may be implemented in combination with the features of other examples. For example, although the description in the specific example may be not described in another example, it may be understood as an explanation related to another example, unless otherwise described or contradicted by the other example.

The terms used in this disclosure may be used only to illustrate an example and may be not intended to limit the present disclosure. Wherein the singular expressions include plural expressions unless the context clearly dictates otherwise.

According to an aspect of the present disclosure, a highly integrated semiconductor package which may be thinned and improved in performance even though a plurality of semiconductor chips may be used, may be provided.

While exemplary embodiments have been shown and described above, it will be apparent to those skilled in the art that modifications and variations could be made without departing from the scope of the present disclosure as defined by the appended claims.

What is claimed is:

1. A semiconductor package comprising:
a plurality of first semiconductor chips each having a first active surface on which a first connection pad is disposed and a first inactive surface, opposing the first active surface, the first semiconductor chips being stacked such that the first connection pads are respectively exposed;

a first encapsulant covering at least a portion of each of the plurality of first semiconductor chips;

a first connection member disposed in a position lower than a position of the plurality of first semiconductor chips and in a lower portion of the first encapsulant, and including one or more first redistribution layers, and a plurality of connection vias electrically connecting the first connection pads of each of the first semiconductor chips to the one or more first redistribution layers, each of the connection vias penetrating into the first encapsulant, and heights of the connection vias being different from each other;

a second semiconductor chip disposed in a position lower than a position of the first connection member, and having a second active surface on which a second connection pad is disposed, and a second inactive surface opposing the second active surface;

a second encapsulant disposed in a position lower than a position of the first connection member, and covering at least a portion of the second semiconductor chip;

a second connection member disposed in a position lower than positions of the second semiconductor chip and in a lower portion of the second encapsulant, and including at least one second redistribution layer electrically connected to the second connection pad; and an electrical connection member passing through the second encapsulant, and electrically connecting the one or more first redistribution layers and the at least one second redistribution layer.

2. The semiconductor package according to claim 1, wherein the electrical connection member comprises a plurality of through-vias passing through the second encapsulant and electrically connecting the first and second redistribution layers, respectively.

3. The semiconductor package according to claim 1, wherein the first encapsulant comprises a photosensitive insulating material.

4. The semiconductor package according to claim 3, wherein the connection vias are filled with a metal material in a photo-via hole penetrating into the first encapsulant, respectively.

5. The semiconductor package according to claim 1, wherein an adhesive film is disposed on the first inactive surface of each of the first semiconductor chips, and in two first semiconductor chips adjacent to each other in a vertical direction among the plurality of first semiconductor chips, a first inactive surface of a first semiconductor chip disposed at a relatively lower position is attached to a first active surface of a first semiconductor chip disposed at a relatively upper position, through the adhesive film.

6. The semiconductor package according to claim 5, wherein an upper surface of the adhesive film disposed on the first inactive surface of an uppermost one of the plurality of first semiconductor chips is substantially coplanar with an upper surface of the first encapsulant.

7. The semiconductor package according to claim 5, wherein a first active surface of the first semiconductor chip disposed at a lowermost side of the plurality of first semiconductor chips is physically spaced apart from a lower surface of the first encapsulant by a predetermined distance.

8. The semiconductor package according to claim 1, further comprising a frame having a through-hole, wherein the plurality of first semiconductor chips are disposed in the through-holes, and the first encapsulant fills at least a portion of the through-hole.

9. The semiconductor package according to claim 1, further comprising a third semiconductor chip disposed in parallel with the second semiconductor chip in a position lower than a position of the first connection member, and having a third active surface on which the third connection pad is disposed, and a third inactive surface opposing the third active surface;

wherein the second encapsulant covers at least a portion of the third semiconductor chip, and the second redistribution layer is electrically connected to the third connection pad.

10. The semiconductor package according to claim 9, wherein each of the first semiconductor chips is a flash chip, the second semiconductor chip is a DRAM chip, and the third semiconductor chip is a controller (CTRL).

11. The semiconductor package according to claim 1, further comprising a plurality of first electrical connection structures disposed in a position lower than a position of the second connection member and electrically connected to the second redistribution layer.

12. The semiconductor package according to claim 1, wherein the electrical connection member is electrically connected to the first redistribution layer via a plurality of second electrical connection structures disposed between the first connection member and the second encapsulant.

13. A semiconductor package comprising:

a plurality of first semiconductor chips each having a first active surface on which a first connection pad is disposed and a first inactive surface, opposing the first active surface, and stacked such that the first connection pads are respectively exposed;

a first encapsulant covering at least a portion of each of the plurality of first semiconductor chips;

a first connection member disposed in a position lower than a position of the plurality of first semiconductor chips and in a lower portion of the first encapsulant, and including one or more first redistribution layers, and a plurality of connection vias electrically connecting the first connection pads of each of the first semiconductor chips to the one or more first redistribution layers, each of the connection vias penetrating into the first encapsulant, and heights of the connection vias being different from each other;

a frame disposed in a position lower than a position of the first connection member, having a through-hole, and including a plurality of wiring layers and one or more layers of wiring vias electrically connecting the plurality of wiring layers;

a second semiconductor chip disposed in the through-hole, and having a second active surface on which a second connection pad is disposed, and a second inactive surface opposing the second active surface;

a second encapsulant disposed in a position lower than a position of the first connection member, and covering at least a portion of the second semiconductor chip;

a second connection member disposed in a position lower than a position of the frame, the second semiconductor chip and in a lower portion of the second encapsulant, and including at least one second redistribution layer electrically connected to the second connection pad;

a plurality of first electrical connection structures disposed in a position lower than a position of the second connection member, and electrically connected to the at least one second redistribution layer; and a plurality of second electrical connection structures disposed between the first connection member and the frame, and electrically connecting the first redistribution layer and the plurality of wiring layers.

14. The semiconductor package according to claim 13, wherein the frame comprises a first insulation layer, a first wiring layer disposed on a lower surface of the first insulation layer, a second wiring layer disposed on an upper surface of the first insulation layer, and a first wiring via passing through the first insulation layer and electrically connecting the first and second wiring layers, and the first and second wiring layers are electrically connected to the first and second redistribution layers.

15. The semiconductor package according to claim 14, wherein the frame further comprises a second insulation layer disposed on a lower surface of the first insulation layer and covering the first wiring layer, a third wiring layer disposed on a lower surface of the second insulation layer, a second wiring via passing through the second insulation layer and electrically connecting the first and third wiring layers, a third insulation layer disposed on an upper surface of the first insulation layer and covering the second wiring layer, a fourth wiring layer disposed on an upper surface of the third insulation layer, and a third wiring via passing through the third insulation layer and electrically connecting the second and fourth wiring layers, and the first to fourth wiring layers are electrically connected to the first and second redistribution layers.

16. The semiconductor package according to claim 13, wherein the frame comprises a first insulation layer, a first wiring layer embedded in the first insulation layer such that a lower surface thereof is exposed, a second wiring layer disposed on an upper surface of the first insulation layer, a second insulation layer disposed on an upper surface of the first insulation layer and covering the second wiring layer, a first wiring via passing through the first insulation layer and electrically connecting the first and second wiring layers, a third wiring layer disposed on an upper surface of the second insulation layer, and a second wiring via passing through the second insulation layer and electrically connecting the second and third wiring layers, and the first to third wiring layers are electrically connected to the first and second redistribution layers.

\* \* \* \* \*